United States Patent [19]
Cordell

[11] Patent Number: 5,875,113
[45] Date of Patent: Feb. 23, 1999

[54] PROCESS TO PREVENT THE EXPLOITATION OF ILLICIT KNOWLEDGE OF THE STRUCTURE OR FUNCTION OF AN INTEGRATED CIRCUIT

[76] Inventor: Steve Cordell, 7836 Bahlingen A.K., Germany

[21] Appl. No.: 746,307

[22] Filed: Nov. 8, 1996

Related U.S. Application Data

[63] Continuation of Ser. No. 614,451, Nov. 16, 1990, abandoned.

[30] Foreign Application Priority Data

Feb. 19, 1990 [DE] Germany .......................... 40 05 003.3

[51] Int. Cl.$^6$ .................................................. H01L 27/00
[52] U.S. Cl. .......................................... 364/489; 364/488
[58] Field of Search .................................... 364/488, 489, 364/490

[56] References Cited

U.S. PATENT DOCUMENTS

| | | | |
|---|---|---|---|
| 4,718,063 | 1/1988 | Reedy et al. | 370/112 |
| 4,766,516 | 8/1988 | Ozdemir et al. | 361/380 |
| 4,939,682 | 7/1990 | Falk | 364/713 |
| 5,121,335 | 6/1992 | Barouch et al. | 364/488 |
| 5,237,633 | 8/1993 | Gaw et al. | 385/14 |
| 5,245,458 | 9/1993 | Taylor | 359/108 |
| 5,247,473 | 9/1993 | Houk et al. | 364/822 |
| 5,266,794 | 11/1993 | Olbright et al. | 250/214 LS |

FOREIGN PATENT DOCUMENTS 39 08 786   8/1989   Germany .

OTHER PUBLICATIONS

"It slices, it fills . . . the amazing ion beam!", *IEEE Spectrum*, Aug. 1989.
Portion of Course Notes from Course taught ny Professor James Massey, Eiedgenosse Tech Hochschule, Zurich, regarding Shannon's 1949 model of a "General Secrecy System", pp. 2.2–2.25, notes taken by applicant.
Optical interconnects replace hardwire, IEEE Spectrum, Mar. 1987, pp. 30–35.
4000–Series Self–Electro–Optic–Effect Devices and K Series Microcomputers, EDN, Sep. 3, 1990. p. 54.
Towards lower–cost focal–plane arrays, Interavia Aerospace Review, Nov. 1989, pp. 1123–1126.
Darpa's Phase–1 Mimic Program to Yield Wide Range of Chips for EW and Avionics; Aviation Week & Space Technology, Sep. 18, 1989, pp. 87 and 89.
Signal, Feb. 1990, p. 76, and.
Parole, Kodekarten mit Mikroprozessortechnik fur die Zugangsberechtigung, Maschinemarkt, Wurzburg 96 (1990) 42, pp. 56–58.
"Optical Imaging Applied to Microelectronic Chip–to–Chip Interconnections" by Kostuk et al., Applied Optics, vol. 24, No. 17, Sep. 1985, pp. 2851–2858.
"Optical Interconnections for VLSI Systems" by Goodman et al., Proceedings of IEEE, vol. 72, No. 7, Jul. 1984, pp. 850–866.

*Primary Examiner*—Vincent N. Trans
*Attorney, Agent, or Firm*—Blank Rome Comisky & McCauley LLP

[57] ABSTRACT

An electronic device, such as an integrated circuit, is provided with elements, all of which are never used in a single application. These elements are not absolutely decoys or dummys, although this is a possibility. For a particular application, the elements are so chosen that, in conjunction with a supplementary logic package, they provide the desired functions. The logic elements used as well as the functions of the main logic package of the device are determined by the supplementary logic. The combined logic is in no way determined by coding or decoding; this logic is specific and both parts together form an electronic component or device. The complete logic is therefore similar to a hybrid circuit but without the wired connections. If this device is compromised to an enemy or a business competitor, the main logic package or packages of the the device need not be newly developed; only the supplementary logic package or packages must be replaced. The function of the device and therefore the function of the equipment using it can thus be changed when the need arises. These additional functions as well as the dummy functions would of course be planned and developed from the beginning.

16 Claims, 2 Drawing Sheets ent useful nature, even after intensive analysis. Even
PROCESS TO PREVENT THE EXPLOITATION OF ILLICIT KNOWLEDGE OF THE STRUCTURE OR FUNCTION OF AN INTEGRATED CIRCUIT This is a continuation of application Ser. No. 07/614,451, filed on Nov. 16, 1990 now abandoned.

FIELD OF THE INVENTION

The present invention relates to a process for rendering useless any knowledge about the internal structure or function of a secret device obtained by the capture of the device and its subsequent analysis by an enemy or business competitor, and also to an economical process of restoring other related devices in the arsenal to a similar secrecy level and with the required performance after such an enemy analysis.

BACKGROUND OF THE PRIOR ART

Due to the nature of the lengthy design, fabrication and test processes, the method of developing integrated circuits (IC) for devices has in the past precluded the implementation of variable IC functions within a device. Any variation of device function due to variations in the chip has been due to the internal logic on the chip or due to a stored program on or outside of the chip. These logical functions are either deterministic, and thus reproducible by an unauthorized person or unit, or variable to such an extent that the performance of the chip is reduced, due to functional encoding, enciphering, path decoding, etc. The newer programmable gate arrays, programmable from a non-volatile memory on startup, can be reprogrammed as a defence against unauthorized possession of the device. These devices, being volatile, cannot be used in all applications, and suffer from the above mentioned performance losses. More important, however, is the fact that these variable devices represent merely the logical control inputs to the other secret devices. Heretofore there has been no adequate protection against gaining knowledge of the performance, structure and function of these main devices within the equipment.

Object of the Invention

It is therefore an object of the invention to eliminate the problems associated with the current integrated circuits, whose function and structure can be compromised in case they fall into possession of unauthorized persons. By using the teachings of the present invention, no knowledge about the IC's function or structure may be obtained which is of a permanent useful nature, even after intensive analysis. Even so, the party losing the IC, fearing that the IC's function or structure has been compromised, may exchange relatively uncomplicated parts of the device with other parts of the same or similar complexity, thus extending the usefulness of the more complicated part or parts of the IC. The foregoing object is achieved by the present invention, which provides a method for automatically selecting one or more functions of an electronic device by using at least one main package for the main part of the function or the main logic functions, and by using at least one or more removable supplementary packages for other parts of the function or the supplementary logic functions, and using said supplementary logic functions to determine the selection of said main logic functions of the main package or packages, and by employing wireless connections by connecting the main package or packages and the supplementary package or packages via optical or electromagnetic paths. The use of optical interconnections between integrated circuits and the use of integrated optical-electronic circuits is discussed in the March, 1987 issue of the *IEEE SPECTRUM* at pages 30–35. For example, on page 35 of that article, there is shown in FIG. 7 a gallium arsenide transceiver manufactured by Honeywell which accepts both electrical and optical inputs and generates both electrical and optical outputs. A specific device which is known and in which all physical connections are optical is the AT&T Bell Laboratories 4000-series family of Self-Electro-Effect Devices (SEEDs), which were described on page 54 of the Sep. 3, 1990 issue of EDN. As discussed in the product announcement, the optical physical connections are accomplished by directing optical beams on the top of the arrays which perform all of the addressing and control of each element within the array.

Another known device which allows for the optical transmission to and from integrated circuits is discussed in the November 1989 issue of *INTERAVIA Aerospace Review*, at pages 1123–1126. In that article, an infrared focal-plane array developed by Texas Instruments and other companies is discussed. The transmission of electromagnetic signals between main and supplementary logic packages is also known, for example, from the Sept. 2, 1989 issue of *Aviation Week & Space Technology*, at pages 87 and 89, in which Westinghouse's technique of testing signal amplitude on chips while the chips are still on the wafer is disclosed. The on-wafer chip is pulsed and its response is measured, thus demonstrating that a wafer-scale component may be irradiated with electromagnetic energy. Similarly, the final chip, after being sliced from the wafer as an integrated circuit, may also be irradiated, since that is its purpose.

Another device, a gallium arsenide millimeter wave monolithic IC receiver chip which is designed for use at 35 GHz is disclosed in the February 1990 issue of *Signal* at page 76. As discussed in that article, applications for that chip are given as a millimeter wave speedometer for employment as a radar set in front of a car. The chip is both a receiver and a transmitter and contains on-chip integrated logic.

While other examples could be given, the foregoing examples are believed sufficient to demonstrate the existence of integrated circuit packages which employ wireless connections via either optical or electromagnetic paths. The advantage is that the connected parts represent a certain function. If it is suspected that the enemy or a business competitor knows the function, the combination of functions in the logic parts can be changed. If the main part of the logic embodies decoy or dummy functions as well as a plurality of logic functions, the effort to analyse the structure and function of the integrated circuit would not be economical; the unauthorized user would know that the function would be immediately changed. Furthermore, by the current method of fabrication of complicated and expensive integrated circuits, if a part of the logic is faulty, the complete circuit (i.e. chip on a silicon wafer) is useless. If, however, a supplementary logic part would be available for selection according to the teachings of the present invention, a complete set of logic could be selected from the complete set of partly redundant logic, and the manufacturing yield could be increased. Further, the present invention achieves the foregoing object by employing one or more of said supplementary packages which are removable from said main package or packages and by employing replaceable supplementary packages by connecting them via said wireless connections in the place of the removable supplementary packages. The advantage is that without requiring any access whatsoever to the IC logic, the function of the IC can be changed. If the logic is a hybrid logic package of IC's, then any new supplementary logic package may communicate with a plurality of the IC's of the hybrid package.

Further, the present invention achieves the foregoing object by transmitting connecting signals between the said supplementary package or packages and the said main package or packages directly without converting or encoding said signals. The advantage is that time-consuming extra functions, which do not contribute to the actual functions of the IC, need be only sparingly used, if at all. Depending on the mission, secrecy of the logic functions need only be guaranteed for a period of hours or possibly days.

Further, the present invention achieves the foregoing object by providing that the device without a power source will have a random logic state which is different from the last logical state of the device while it was operating under power. The advantage is that if the device undergoes an unauthorized laboratory investigation, no information about the last state of, or the function of the device during its last mission can be determined from its history while it was under power, although its startup state (i.e. power-up state) may be guessed. Further, the present invention achieves the foregoing object by transmitting connecting signals between the said supplementary package or packages and the said main package or packages via wireless means using radioactive rays in the connecting path. The advantage is that new IC's which may be developed in the future may obtain the same degree of protection, according to the teachings of the present invention, as the above-described IC's with optical or electromagnetic connections between the main package and the supplementary package.

SUMMARY OF THE INVENTION

The main principle of the invention is to use as much complication within the logic device as possible without causing a degredation in performance. Any unauthorized person who may investigate the device may thus not automatically achieve knowledge of the function or structure of the device, and only after much time and effort may these details be gained. The complication is achieved by creating an electronic device out of parts, one set of which, the main logic part or parts, is extremely complex and may contain a number of decoy or dummy functions which help to deceive an investigator. The second set of one or more parts of the device is less complicated, is removable, and is used to select one or more of the functions of the main logic part or parts. After use of the device or loss of it, the function or structure may be assumed to have been compromised, and by replacing one or more of the supplementary parts, new functions may be selected from the set of functions already designed into the complex main logic part or parts. In this manner, proven logic may be replaced or upgraded either periodically or when considered necessary. By including feedback to the supplementary logic and by use of some of the functional logic within these replaceable parts, the complexity can be multiplied. The presently preferred method of communication between the main logic packages and the supplementary packages is via optical or electromagnetic means, but in the future other means, such as radioactive communication paths, may be used.

DESCRIPTION OF ILLUSTRATIVE EMBODIMENTS

Figure 1:
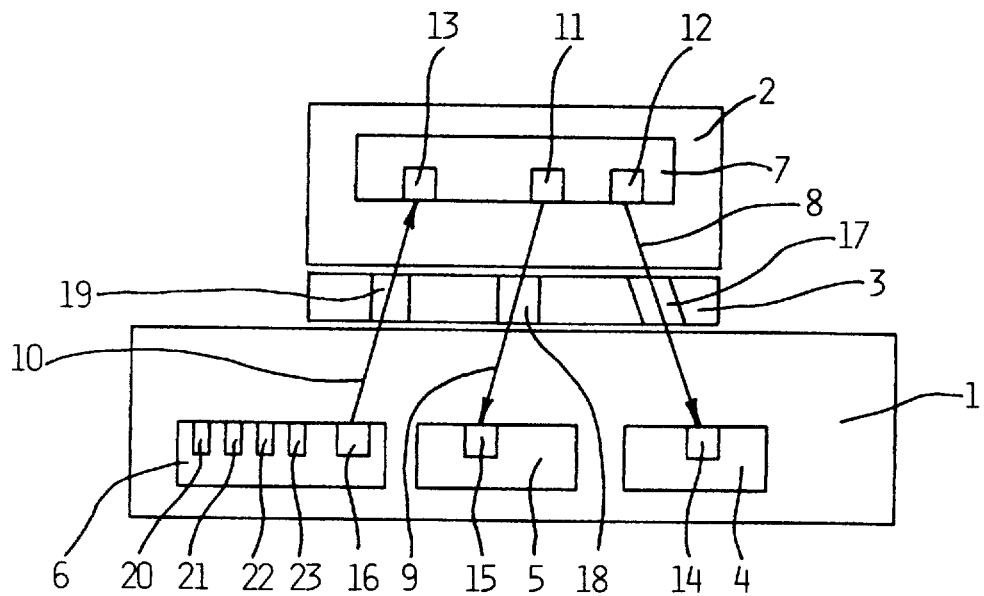
FIG. 1 is the front view of an embodiment illustrating optical communication paths between device components.
Figure 2:
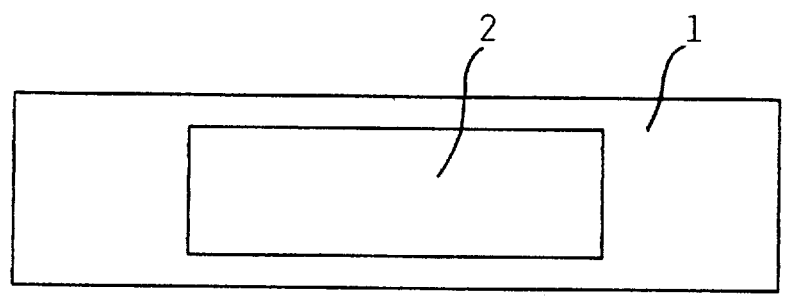
FIG. 2 is the top view of the components of FIG. 1 showing the supplementary package on top of the main package.

FIG. 1 illustrates an electronic device with only one main logic package 1 and one supplementary logic package 2. Inside of the supplementary logic package, there is a single integrated circuit (IC) 7, and inside the main logic package there are three IC's 4, 5 and 6. In this example there is a mask 3 with openings 17, 18 and 19, combined with the supplementary package 2. These openings serve as colimators of the light rays 8, 9 and 10, and prevent scattering of light to other IC's except to the target IC's. Integrated into the IC-element 7 are two light-emitting elements 11 and 12 as well as the light receiving sensor 13. Integrated into the IC-elements 4, 5 and 6 are the light receiving sensors 14 and 15 as well as the light-emitting element 16. The information carrying light ray 10 emits (in the arrowhead direction) through the opening 19 of the mask 3 and thus combines the light-emitting sender 16 with a light-receiving sensor 13, and the light ray 8, for example, emits light (in the arrowhead direction) through the opening 17 from the sender 12 to the receiver 14. The connection between the three IC's 4, 5 and 6 are possible via the customary wiring connections; these connections are not illustrated in FIG. 1. Likewise not shown are the electrical and ground lines, which can be supplied via the customary methods. One method in which the function or functions of the main package may be selected is the choice of some of the functions directly after the startup of the device via the transmitted information. Later, the chosen logical connections remain, as long as the device remains under power. During operation, the one-way information connections also remain effective in order to control the functional states of the main logic package. In this example, the one-way connection between the logic packages 1 and 2 are represented. A possible variation with feedback between the main and the supplementary logic packages is described below in a separate paragraph.

A laboratory investigation of the device of FIG. 1 could possibly show which additional functions could be selected. It is, however, impossible to find out which functions of the main logic package 1 could be selected when the supplementary logic package 2 is replaced by another package. This follows from the complexity of the elements of the device, and not as hitherto from the security coding, crypto encoding, and similar methods. This complexity can be multiplied through the use of decoy or dummy functions, as well as by a plurality of light receiving sensors 20, 21, 22 and 23 in IC 6 as well as in the other IC's 4 and 5 (sensors not shown), which may be addressed by other supplementary logic package types, in case the supplementary package 2 is replaced and the replacement is connected to the main logic package in the device.

Figure 3:
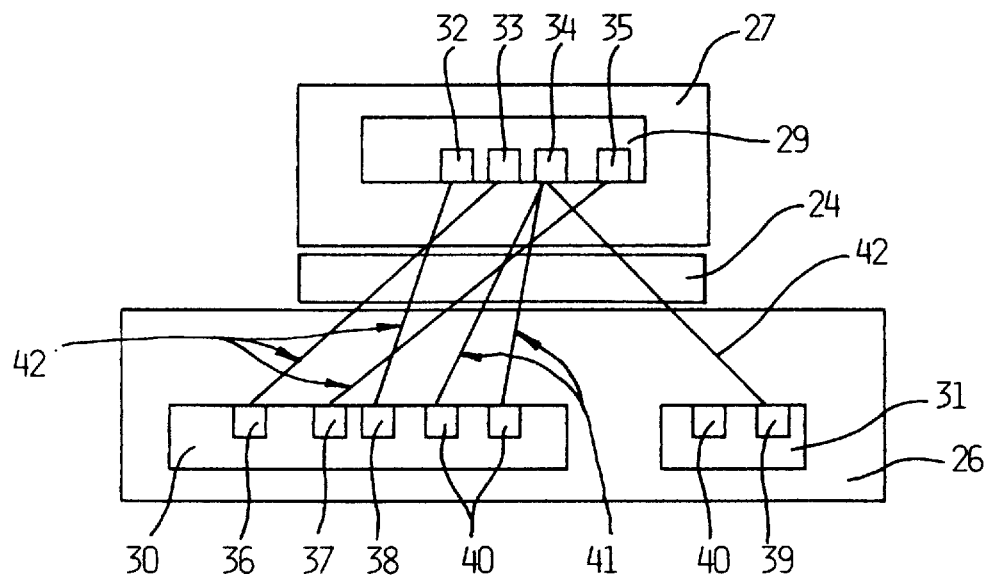
FIG. 3 is the front view of an embodiment illustrating radioactive communication paths between device components.
Figure 4:
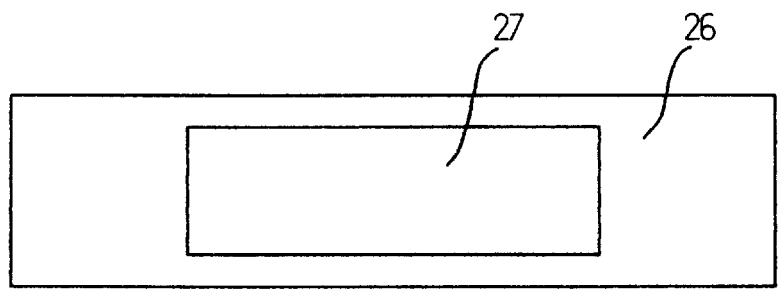
FIG. 4 is the top view of the components of FIG. 3 showing the supplementary package on top of the main package.

FIG. 3 illustrates a device with a main logic package 26 and a supplementary logic package 27. In the supplementary package 27, there is an IC 29 which is provided with small, protected packages 32, 33, 34 and 35 of Americium 241 or similar material. In the main logic package 26 there are two IC's 30 and 31 which are provided with radioactivity receivers 36, 37, 38 and 39, as well as the dummy radioactivity receivers 40. The mask 24 with corresponding openings is attached to the supplementary logic package 27 and serves to eliminate scattering of radioactivity. The mask openings are not shown in the figure. A method for selecting the functions of the main logic package is the choice of the function via the combination of the addressed radioactivity receptors directly after the startup of the device and after an optional selftest of the main logic package 26. The dummy receptor 40 is also irradiated, for example via the path 41, in order to increase the difficulty of a laboratory investigation. Some of the other receptors 36, 37, 38 and 39 are also irradiated via the path 42, and this path determines the startup state (i.e. the functional selection) of the device via the logic of the main logic package. A modulation of the emitted rays to increase its informational content and increase the complexity of the device is at this time in this variation not possible, but is not an impossibility in the future.

DESCRIPTION OF A DEVICE WITH FEEDBACK BETWEEN LOGIC PACKAGES

Not shown in a figure is a further example which makes possible the selection of the function of the main logic package through information from the supplementary logic package via electromagnetic paths. The supplementary logic package or packages and the main logic package or packages are provided with electromagnetic transmitters and receivers. The functions of the main logic packages are predefined by the information from the supplementary logic packages and from the logic of the main logic packages. Such micro-transmitters and receivers are realisable today in experimental devices and should be state of the art and generally available in the near future. In order to multiply the complexity of the device further, and therefore to increase the security against its misuse, both the main and supplementary logic packages may be provided with transmitters and receivers, as described above. Information between the packages will be sent in both directions between the logic packages and via complex paths both between the packages and within the logic packages themselves.

What is claimed is:

1. A method for automatically selecting at least one function of an electronic device, especially a device made up of a plurality of integrated circuit parts whose functions are at least one of real logic functions and decoy and dummy functions, comprising the steps of using at least one main package for main logic functions, using at least one removable supplementary package for supplementary logic functions, and using said supplementary logic functions to determine the selection of said main logic functions of the at least one main package by employing wireless connections for connecting the at least one main package and the at least one supplementary package using at least one of optical and electromagnetic paths.

2. Method according to claim 1, wherein said at least one supplementary package is removable from said at least one main package and wherein at least one supplementary package may be used by connecting it via said wireless connections in the place of said at least one removable supplementary package.

3. Method according to claim 1, wherein connecting signals between said at least one supplementary package and said at least one main package are transmitted directly without one of converting and encoding said signals.

4. Method according to claim 1, wherein said electronic device without power has a random logic state which is different from a last logical state of the device while it was operating under power.

5. Method according to claim 1, wherein connecting signals are transmitted between said at least one supplementary package and said at least one main package via wireless means using radioactive rays in the connecting path.

6. Apparatus for the automatic selection of at least one function of an electronic device, especially an integrated circuit, hybrid circuit and similar circuits, for the accomplishment of the method according to claim 1, wherein said integrated, hybrid and similar circuits are embodied in said device by at least one replaceable supplementary package and by employing at least one main package embodying a plurality of selectable logic functions, including at least one of real, decoy and dummy functions.

7. Apparatus for the automatic selection of at least one function of an electronic device, especially an integrated circuit, hybrid circuit and similar circuits, for the accomplishment of the method according to claim 1, by logically connecting said at least one main package to said at least one supplementary package.

8. Apparatus for the automatic selection of at least one function of an electronic device, especially an integrated circuit, hybrid circuit and similar circuits, for the accomplishment of the method according to claim 1, by supplying the said at least one main and at least one supplementary packages with one of common and separate electrical and ground sources.

9. Apparatus for the automatic selection of at least one function of an electronic device, especially an integrated circuit, hybrid circuit and similar circuits, for the accomplishment of the method according to claim 1, by embodying the device with at least one main package and at least one supplementary package, by connecting these device parts together, and embodying the supplementary packages with functions which select logical functions within the main packages.

10. Apparatus for the automatic selection of at least one function of an electronic device, especially an integrated circuit, hybrid circuit and similar circuits, for the accomplishment of the method according to claim 1, by embodying the at least one main package with basic logical functions, and by embodying supplementary logic functions with information and logic for combining send supplementary logic functions with logic of the at least one main package and for creating the logical connection between the packages.

11. Apparatus for the automatic selection of at least one function of an electronic device, especially an integrated circuit, hybrid circuit and similar circuits, for the accomplishment of the method according to claim 1, by employing cross-communication paths between a plurality of main packages and between a plurality of supplementary packages for transmitting information between said packages.

12. Apparatus for the automatic selection of at least one function of an electronic device, especially an integrated circuit, hybrid circuit and similar circuits, for the accomplishment of the method according to claim 1, further including the step of embodying between the main and supplementary packages appropriate masks of at least one of thin metal film, thick metal film, special glass lead and other metallic and non-metallic materials and masks from a combination of said material to one of collimate and forms the information in the communication paths between the main and supplementary packages and to reduce scattering from said communication path.

13. A method for automatically selecting at least one function of an electronic device, especially a device made up of a plurality of integrated circuit parts whose functions are real logic functions and possibly decoy and dummy functions, comprising the steps of using at least one main package for main logic functions, using at least one removable supplementary package for supplementary logic functions, and using said supplementary logic functions to determine the selection of said main logic functions of the at least one main package by employing wireless connections for connecting said at least one main package and said at least one supplementary package using one of optical and electromagnetic paths.

14. Apparatus for the automatic selection of at least one function of an electronic device, especially an integrated circuit, hybrid circuit and similar circuits, for automatically selecting at least one function of an electronic device made up of a plurality of integrated circuit parts, wherein integrated, hybrid and similar circuits are embodied in said device by at least one replaceable supplementary circuit package and by employing at least one main circuit package embodying a plurality of selectable logic functions, including at least one of real, decoy and dummy functions and further including wireless connection means for connecting said at least one main circuit package to and said at least one supplemental package using one of optical and electromagnetic paths.

15. The apparatus of claim 14, wherein said at least one main circuit package is logically connected to said at least one supplementary circuit package.

16. The apparatus of claim 14, wherein said at least one main and at least one supplementary circuit packages are supplied with one of common and separate electrical and ground sources.

* * * * *